Jan. 19, 1960 R. A. RUNYAN 2,922,114
SIGNAL AMPLIFYING SYSTEM
Filed Jan. 11, 1954
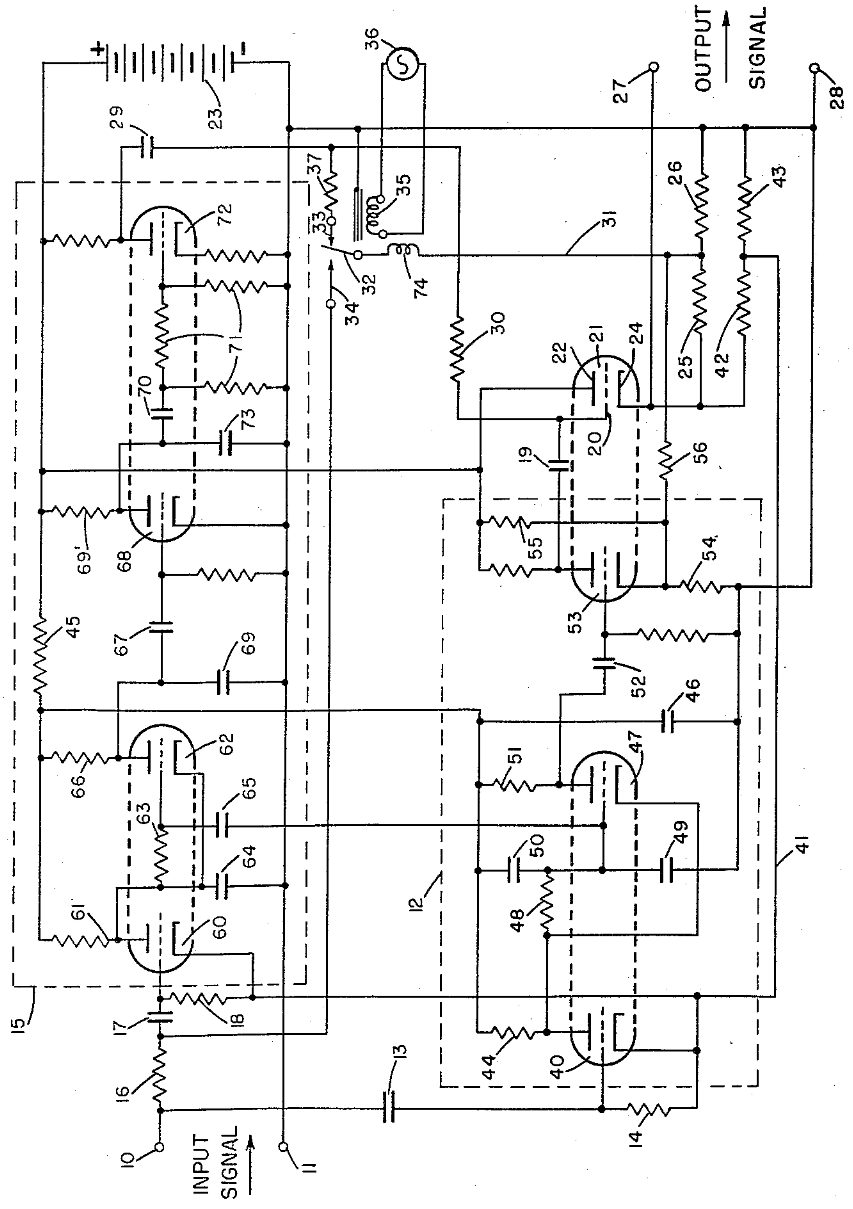
INVENTOR.
RAYMOND A. RUNYAN
BY Robert Hockfield
HIS ATTORNEY United States Patent Office 2,922,114
Patented Jan. 19, 1960

2,922,114

SIGNAL AMPLIFYING SYSTEM

Raymond A. Runyan, Ridgefield, Conn., assignor, by mesne assignments, to Schlumberger Well Surveying Corporation, Houston, Tex., a corporation of Texas Application January 11, 1954, Serial No. 403,285
7 Claims. (Cl. 330—9)

This invention relates to signal-amplifying systems and, more particularly, pertains to an improved amplifier capable of translating signal frequencies over a wide range of frequencies having essentially no lower limit, commonly referred to as a direct-current (D.C.) amplifier.

Conventional D.C. amplifiers are comprised of a plurality of stages directly connected in cascade, i.e., no coupling condensers are employed. Any slowly-varying potential applied to the input of the system may be satisfactorily amplified, but if instabilities occur in an early stage of amplification, or if the power supply potential changes, the resulting potentials are also amplified and the output potential of the amplifier undesirably drifts in a random manner generally unrelated to the input signal.

One arrangement which has been proposed to overcome this obvious deficiency of conventional D.C. amplifiers includes means for deriving an error signal representing unwanted drift. The error signal is usually amplified and employed to control balance in the amplifying system.

Since the principal amplifier portion of the system is basically a directly-connected amplifier, variations in power supply potential are amplified, just as in a conventional circuit. Consequently, although correction is utilized, the range of power supply voltage that may be tolerated is too small for many applications. Moreover, stability problems limit the speed of correction that can be achieved, hence transients in the power-supply voltages produce undesired output signals.

It is therefore, an object of the present invention to provide an improved signal-amplifying system capable of translating frequencies in a range having essentially no lower limit (i.e., zero frequency) and not subject to the foregoing deficiencies of prior art arrangements.

Another object of the present invention is to provide an improved signal-amplifying system which operates stably and reliably, and yet is relatively insensitive to large variations in power supply voltage.

Briefly stated, a signal-amplifying system in accordance with the present invention comprises a first amplifier channel for translating input signal frequency components in a range of frequencies above a crossover frequency, and a second amplifier channel responsive to a carrier signal having a frequency higher than the crossover frequency. This second channel is coupled in parallel relation with the first channel and effectively translates input signal frequency components in a range of frequencies below the crossover frequency.

More specifically, the carrier signal has an amplitude representing the difference between the amplitudes of a predetermined fraction of the output signal of the system and the input signal. The system is so phased that, after the carrier signal is amplified in the second channel and rectified, the resulting potential adjusts the output signal of the system to minimize the aforesaid difference. This occurs for frequency components within the range below the crossover frequency, whereas frequency components above the crossover frequency are suitably amplified by the first channel.

As used herein, the term "crossover frequency" is intended to denote a point in the frequency spectrum separating the major components in adjacent frequency ranges. That is, while the major frequency components in the two ranges may lie on either side of the "crossover frequency," one or both of the ranges may also include frequency components of minor amplitude which overlap into the other range.

The novel features of the present invention are set forth with particularity in the appended claims. The present invention, both as to its organization and manner of operation, together with further objects and advantages thereof, may best be understood by reference to the following description taken in connection with the accompanying drawing in which the single figure is a circuit diagram of a signal-amplifying system embodying the present invention.

In the drawing, the signal-amplifying system constructed in accordance with the instant invention is shown to comprise a pair of input circuit terminals 10, 11 coupled to a first amplifier channel 12 by a coupling condenser 13 associated with an input resistor 14. Terminals 10, 11 are further coupled to a second amplifier channel 15 via a resistor 16 and a coupling condenser 17 connected in series relation and associated with an input resistor 18.

Signal amplifying channel 12 is connected by a coupling condenser 19 to the control electrode 20 of an electron discharge device 21 having its anode 22 directly connected to the positive terminal of a source 23 of B— supply potential and its cathode 24 connected to the negative terminal of source 23 through a voltage divider including series-connected resistors 25 and 26. Device 21 thus operates as a cathode follower. The resistors 25 and 26 are included in an output circuit for the signal amplifying system connected to output terminals 27 and 28 at which amplified output signals are derived.

The output of amplifying channel 15 is supplied via a coupling condenser 29 to a rectifier or demodulator of the shunt type to be described hereinafter. The coupling condenser 29 is further connected by a coupling resistor 30 to control grid 20 of cathode follower 21. It is thus evident that channels 12 and 15 are effectively coupled in parallel relation.

Condenser 19 and resistor 30 are apportioned in a well-known manner as a crossover network so that the first channel 12 supplies to cathode follower 21 signal frequency components in a first range of frequencies above a crossover frequency. For example, let it be assumed that the signal-amplifying system is to be operative from essentially zero frequency over a range extending 10,000 cycles per second (c.p.s.). A crossover frequency of 30 c.p.s. may be selected and channel 12 translates signal frequencies in a range from approximately 30 c.p.s. to approximately 10,000 c.p.s.

Channel 15, on the other hand, is responsive primarily to a carrier frequency higher than the crossover frequency, such as 400 c.p.s. and, as may be more evident from the discussion to follow, this channel effectively translates and supplies to cathode follower 21 input signal frequency components in the range of frequencies below the crossover frequencies, i.e., from zero frequency to approximately 30 c.p.s.

The junction of output resistors 25 and 26 is connected by a lead 31 to the movable arm 32 of a vibrator or switch device which includes fixed contacts 33 and 34. Movable contact 32 cyclically engages fixed contacts 33 and 34 in alternation under the influence of the magnetic field developed by an actuating coil 35 supplied with an alternating potential at a frequency of 400 c.p.s. from a source 36.

Fixed contact 33 is connected by a resistor 37 to the junction of condenser 29 and resistor 30. Fixed contact 34 is connected to the junction of resistor 16 and condenser 17 in the input circuit portion of the system.

In operation, an input signal having frequency components in a range from essentially zero to 10,000 c.p.s. is applied between input terminals 10 and 11. After amplification in channel 12, any frequency components below 30 c.p.s. are attenuated by crossover network 19, 30, while those components in the range from 30 to 10,000 c.p.s. are amplified and supplied to cathode follower 21. Thus, the latter components are derived at output terminals 27, 28.

Source 36 continuously drives switch device 32—34 and a translating circuit is periodically completed from the output circuit of the system to the input circuit via lead 31, moving contact 32 and fixed contact 34 at a rate corresponding to the selected frequency of operation for amplifying channel 15. If the voltage so applied is equal to the input signal voltage, there is no 400 cycle resultant. However, if these voltages differ, a 400 cycle error signal is developed having an amplitude and polarity or phase representing the difference. In other words, vibrator 32—34 and its associated circuit constitute the means for not only chopping or modulating the system input signal to provide a 400 cycle signal which may be amplified by the A.C. amplifying channel 15, but also to provide so-called chopper-stabilization whereby such 400 cycle input signal has an amplitude which, in alternate half-cycles, corresponds with the system input signal and with a fixed fraction of the system output signal, respectively. The fixed fraction of the output signal, as represented by the feedback signal applied via contacts 32, 34, corresponds with the ratio of the resistance 26 to the sum of the resistances 25 and 26 (or only resistance 25 to a good approximation) and serves to stabilize the channel gain. Thus, the ratio of the resistances 25 and 26 determines the gain or amplification factor of channel 15 for frequency components in the zero to 30 c.p.s. range. Accordingly, for a gain of 1000, resistor 25 has a resistance 1000 times the resistance value of resistor 26.

It is thus evident that resistor 26 is much smaller in resistance than resistor 25. For example, to provide a suitable cathode load for device 21, resistor 25 may have a resistance of 47,000 ohms and resistor 26 may be 47 ohms to achieve a gain of 1000.

Each time moving contact 32 engages fixed contact 33, the output of channel 15 is shunted by a low impedance (resistor 26) and attenuated thereby to a very small fraction of the output signal. Contacts 32 and 33 thus function as a switch-type of synchronous rectifier for effectively rectifying or demodulating the output of channel 15 prior to application to control electrode 20 of cathode follower 21. The resulting unidirectional potential is so phased as to reduce the error voltage at the input of channel 15 and a desired correction in the output of channel 15 is effected. Accordingly, channel 15 effectively translates input signal frequency components in a range of frequencies below the crossover frequency of 30 c.p.s.

Turning now to the circuit details of the amplifying channels, channel 12 includes a first electron discharge amplifier device 40 having resistor 14 in its control electrode-cathode circuit. The cathode circuit for device 40 is completed by a lead 41 connected to the junction of a pair of series-connected resistors 42 and 43 which are shunted across output circuit terminals 27 and 28. Resistors 42 and 43 are apportioned in essentially the same manner as resistors 25 and 26. They are employed in the output circuit to derive degenerative feedback while avoiding cathode current flow in resistor 26.

An anode load impedance 44 is connected to the positive terminal source 23 via a decoupling resistor 45 (shown in channel 15) associated with a shut, decoupling condenser 46. The anode of device 40 is connected directly to the cathode of another electron discharge device 47 and to the control electrode of this device by a filter resistor 48. The filter circuit is completed by a bypass condenser 49 which bypasses essentially all frequency components so that device 47 operates as a cathode-driven amplifier. Another bypass condenser 50, connected from the junction of resistor 48 and condenser 49 to resistor 45, is employed to reduce extraneous noise potentials which may originate in source 23.

An anode load resistor 51 is provided for device 47 and its anode is connected by a coupling condenser 52 to a conventional triode amplifier 53 provided with a cathode resistor 54. This resistor together with another resistor 55 form a voltage divider shunted across source 23. The junction of resistors 54 and 55 is connected by a coupling resistor 56 to the junction of resistors 25 and 26.

Amplifier channel 12 thus effects an even number of phase reversals on an applied input signal and its gain and linearity in operation are stabilized by degenerative feedback supplied over lead 41 to the cathode of electron tube 40.

The voltage developed at resistor 54 provides a bias for tube 53 and is applied over resistor 56 to the output circuit in order to achieve a zero balance for the system. That is, with no signal input to the amplifying system, the voltage between output terminals 27 and 28 may not be correctly at a value of zero. The connection just discussed is employed to obtain the desired zero voltage for the no signal condition.

Channel 15 includes an input stage 60 having resistor 18 in its grid-cathode circuit. The cathode circuit of tube 60 is completed by an extension of lead 41, and an anode load resistor 61 is connected to power supply 23 via decoupling resistor 45. The anode of device 60 is connected directly to the cathode of another electron discharge device 62 and to the control electrode by a filter resistor 63 associated with a bypass condenser 64. Another bypass condenser 65 is connected between the grid of tube 62 and the junction of condensers 49 and 50.

The output of cathode-driven amplifier tube 62, developed at its anode load 66, is supplied over a coupling condenser 67 to a conventional triode amplifier device 68. A shunt condenser 69 is included in this coupling circuit in order to limit the high frequency response of the channel so that essentially few if any frequency components higher than 400 c.p.s. are translated. Amplified signal components at anode resistor 69′ are applied via a coupling condenser 70 and a $\pi$-type attenuator 71 to the control electrode of another electron discharge triode 72. A bypass condenser 73 is included in this network for minimizing the amplitude of high frequency signal components. Amplified signals at the anode of device 72 are supplied over coupling condenser 29 to rectifier 32—33 and its associated circuit.

The several bypass condensers which are employed to limit the high frequency response of channel 15 may produce an undesirable phase shift on a 400 c.p.s. signal and adversely affect the operation of the synchronous rectifier. Thus, the capacitance values of coupling condensers 17, 67, 70 and 29 are selected at low values to minimize overall phase shift and permit proper rectification.

Amplifying channel 15 provides an odd number of phase reversals on an applied signal. However, since this channel is responsive primarily to the 400 c.p.s. error signal derived by means of chopper 32, 34 which effectively produces a phase reversal, the portion of the system including channel 15 and the chopper is degenerative in operation. In other words, since modulation and demodulation of a 400 c.p.s. signal occur 180° out of phase and an extra phase reversal occurs in channel 15, the error signal may be effectively reduced to zero.

Frequency components of the system input signal which may be at 400 c.p.s. (that is, above the crossover frequency) are actually coupled by the capacitors 13 and 17 to each of the respective channels but are supplied primarily to amplifier channel 12. Because the amplifying channel 12 and cathode feedback to input tube 40 operate to diminish any difference or error between the system input signal and the feedback signal on lead 41 in the frequency range above the crossover, the feedback signal has components in such frequency range substantially equal to those of the system input signal. Hence, the degenerative feedback connection, including lead 41 which extends to the cathode of amplifier stage 60 in channel 15, provides a signal that effectively cancels such components at the input circuit of stage 60. This is important for, if an incoming 400 c.p.s. signal component were permitted to traverse amplifier channel 15, a false error signal may be developed. This produces beat frequencies for signals separated from 400 c.p.s. by less than the pass band of amplifier channel 15 and is detrimental to proper operation in the range of frequencies from zero to 30 c.p.s.

Referring to the input signal to channel 15 developed across input resistor 18, it may be noted that when chopper contacts 32, 34 complete a feedback loop between the junction of resistors 25, 26 and the junction of resistor 16 and capacitor 17, substantially the same feedback signal is applied to both terminals of resistor 18 and the net channel input is therefore substantially zero regardless of the value of the system input signal. During alternate half cycles at the 400 cycle chopper frequency when contacts 32, 34 are opened, the net channel input signal across resistor 18 is the difference between the system input signal coupled via resistor 16 and capacitor 17, and the feedback signal supplied via lead 41, that is, the error signal. Of course, due to the feedback loop including high frequency channel 12, such error signal input to channel 15 is substantially free of components above the crossover frequency, this result being achieved without requiring a low pass filter in the feedback circuit. The output from channel 15 is therefore a highly amplified version of the channel input error signal applied in alternate half cycles at the chopper frequency and it is this output which is rectified and applied to the crossover network 19, 30.

In order to reduce extraneous signals that may be due to chopper 32—34, a movable loop 74 may be connected in series with lead 31 and moving arm 32. Loop 74 thus may be located experimentally, under zero input signal conditions, to achieve a minimum signal amplitude at output terminals 27 and 28. After such a position is found, the loop is secured in place.

Since the direct coupling to output terminals 27 and 28 terminates at the grid circuit of cathode-follower 21, variations in power supply potential are not amplified by early stages of the amplifying system embodying the present invention. Consequently, a poorly-regulater power supply may be tolerated without experiencing undesired, random voltage fluctuations at output terminals 27 and 28.

In a particular example embodying the features of the present invention, filament voltage variations of plus or minus 15% produced output changes or less than 0.5% under conditions of maximum output. Variations in the potential of supply 23 up to 3% produced no discernable effect. In fact, the amplifying system operated satisfactorily over variations in either plate or filament supply voltages up to 50%.

Therefore, the signal amplifying system embodying the present invention is not subject to the deficiencies of prior art arrangements. It operates stably and reliably, acts quickly, and yet is relatively insensitive to large variations in power supply voltage.

In adidtion, variations in the amplitude and frequency of the voltage supplied by source 36 may be tolerated. For example, voltage fluctuations of 20% and frequency variations of 10% do not adversely disturb the operation of the system.

Moreover, as evident from the drawing, a supply of negative voltage, as required in many prior D.C. amplifiers, is not needed.

While a particular embodiment of the present invention has been shown and described, it is apparent that changes and modifications may be made without departing from this invention in its broader aspects, and therefore the aim in the appended claims is to cover all such changes and modifications as fall within the true spirit and scope of this invention.

I claim:

1. A dual-channel signal amplifying system comprising first and second A.C. amplifiers, means for applying input signals substantially in common to said amplifiers, means for modulating the input to said second amplifier at a carirer frequency and for demodulating the output of said second amplifier, a crossover network for combining said demodulated output in the frequency range from zero to a crossover frequency with the output of said first amplifier which is in a frequency range above said crossover frequency and which includes said carrier frequency, and means for applying a portion of the output signal derived from said crossover network degeneratively to the input of each of said amplifiers to stabilize their gain and to reduce any spurious carrier frequency components in the network output, said modulating means including means for periodically rendering the input signals as applied to the input of said second amplifier substantially equal and opposite to said degeneratively applied portion of said output signal.

2. A system for amplifying an input signal over a wide band of frequencies, comprising first and second amplifying channels coupled in parallel between input and output terminals, a crossover network for combining the outputs of said first and second channels in respective high and low frequency ranges to produce a wide band output signal at said output terminals, a voltage divider connected between said output terminals for providing a feedback signal which is a fraction of said output signal, means for combining said feedback signal degeneratively with an input signal applied to said input termnials to obtain an error signal at the input of each of said channels, and means for selectively modulating said error signal at the input of said second channel at a frequency in the range amplified by said first channel and for synchronously demodulating the output of said second channel, whereby the demodulated output of said second channel in said low frequency range is combined with the unmodulated output of said first channel in said high frequency range to derive said wide band output signal, said modulating means including means for connecting said voltage divider with the input of said second channel periodically to reduce the error signal applied thereto substantially to zero.

3. A system for amplifying an input signal over a wide band of frequencies, comprising first and second A.C. amplifiers coupled in parallel between input and output terminals, a crossover network for combining the outputs of said first and second amplifiers in respective high and low frequency ranges to produce a wide band output signal at said output terminals, a voltage divider connected between said output terminals for providing a feedback signal which is a fraction of said output signal, means coupled between said voltage divider and the input of each of said amplifiers for combining said feedback signal degeneratively with an input signal applied to said input terminals to obtain an error signal at the input of each of said amplifiers, and means coupled to the input of said second amplifier and periodically to said voltage divider for selectively modulating said error signal at a frequency in the range amplified by said first amplifier and coupled to the output of said second amplifier for synchronously demodulating the output of said second amplifier, whereby the demodulated output of said second amplifier in said frequency range is combined with the unmoduated output of said first amplifier in said high frequency range to drive said wide band output signal.

4. A system for amplifying an input signal over a wide band of frequencies, comprising first and second A.C. amplifiers coupled in parallel between input and output terminals, a crossover network for combining the outputs of said first and second amplifiers in respective high and low frequency ranges to produce a wide band output signal at said output terminals, a voltage divider connected between said output terminals for providing a wide band feedback signal which is a fraction of said output signal, means coupled between said voltage divider and the input of each of said amplifiers for combining said wide band feedback signal degeneratively with an input signal applied to said input terminals to obtain an error signal at the input of each of said amplifiers, the high frequency components of said error signal at the input of said second amplifier being degenerated by the feedback loop including said first amplifier, and means for selectively modulating said error signal at the input of said second amplifier at a frequency in the range amplified by said first amplifier and for synchronously demodulating the output of said second amplifier, whereby the demodulated output of said second amplifier in said low frequency range is combined with the unmodulated output of said first amplifier in said high frequency range to derive said wide band output signal, said modulating means including means for periodically rendering the input signal as applied to the input of said second amplifier substantially equal and opposite to said fraction of said output signal, whereby the error signal at the input of said second amplifier is periodically reduced substantially to zero.

5. A system for amplifying an input signal over a wide band of frequencies, comprising first and second A.-C. amplifiers coupled in common to a pair of input terminals to which said input signal is applied, means including a crossover network for coupling the outputs of said first and second amplifiers in respective high and low frequency ranges to produce a wide band output signal at common output terminals for said amplifiers, a voltage divider connected between said output terminals for providing a wide band feedback signal which is a fraction of said output signal, means coupled between said voltage divider and the input of each of said amplifiers for combining said wide band feedback signal degeneratively with said input signal to obtain an error signal at the input of each of said amplifiers, the high frequency components of said error signal at the input of said second amplifier being degenerated by the feedback loop including said first amplifier, and means including a chopper connected between said voltage divider and the input of said second amplifier for periodically reducing the input of said second amplifier substantially to zero at a frequency in the range amplified by said first amplifier to modulate the input and for synchronously demodulating the output of said second amplifier, whereby the demodulated output of said second amplifier in said low frequency range is combined with the unmodulated output of said first amplifier in said high frequency range to derive said wide band output signal.

6. A system as defined in claim 5 wherein said voltage divider has parallel branches, said feedback signal being provided at a point along one of said branches, said chopper having one terminal connected to a corresponding point along another of said branches to derive a potential substantially equal to said feedback signal for periodic application to the input of said second amplifier in lieu of said input signal and in balanced, opposing relation with respect to said feedback signal applied thereto.

7. A system for amplifying an input signal over a wide band of frequencies, comprising first and second amplifying channels coupled in parallel between input and output circuits, each of said channels including a pair of input terminals and amplifier stages capacitively coupled in cascade to said terminals, said input circuit including capacitors for coupling said input signal to one of the input terminals for each of said channels, said output circuit including means for combining the outputs of said first and second channels in respective high and low frequency ranges to derive a wide band output signal across output terminals and a voltage divider connected across said output terminals for providing a feedback signal which is a small fraction of said output signal, means for applying said feedback signal degeneratively to the other of the input terminals for each of said channels to produce at the input terminals of each channel an error signal representing the difference between said input signal and a fraction of said output signal, said channels each being responsive to said error signal for diminishing in the respective frequency ranges the difference represented thereby, and switching means connected with said voltage divider for periodically applying to said one of the input terminals for said second channel a signal substantially equal to said feedback signal applied to the other of the input terminals for said second channel to reduce the input thereto substantially to zero and for alternately reducing the output of said second channel to said fraction of said output signal at a frequency of alternation in the range amplified by said first channel, whereby a demodulated output is obtained from said second channel in said low frequency range for combining with the unmodulated output of said first channel in said high frequency range to derive said wide band output signal.

References Cited in the file of this patent

UNITED STATES PATENTS

| | | |
|---|---|---|
| 1,749,045 | Nyquist et al. | Mar. 4, 1930 |
| 2,459,730 | Williams | Jan. 18, 1949 |
| 2,605,333 | Job | July 29, 1952 |
| 2,709,205 | Colls | May 24, 1955 |
| 2,748,201 | McMillan | May 29, 1956 |
| 2,757,244 | Tomcik | July 31, 1956 |
| 2,775,657 | Van Zelst | Dec. 25, 1956 |
| 2,781,423 | Kuczun et al. | Feb. 12, 1957 |

OTHER REFERENCES

Publication—Radio Electronics, vol. 24, Issue 2, February 1953, pages 58 and 59, "Dual-Channel Remote Amplifier," by Jordan, Jr.